United States Patent [19]

Miller et al.

[11] 4,276,543
[45] Jun. 30, 1981

[54] MONOLITHIC TRIPLE DIFFUSION ANALOG TO DIGITAL CONVERTER

[75] Inventors: Ralph W. Miller; James G. Peterson, both of Manhattan Beach, Calif.

[73] Assignee: TRW Inc., Redondo Beach, Calif.

[21] Appl. No.: 21,577

[22] Filed: Mar. 19, 1979

[51] Int. Cl.² ............................................. H03K 13/175
[52] U.S. Cl. ................................ 340/347 AD; 358/13
[58] Field of Search .................. 340/347 AD; 357/48; 358/13

[56] References Cited

U.S. PATENT DOCUMENTS 3,981,072   9/1976   Buie ......................................... 357/48

FOREIGN PATENT DOCUMENTS 2419816  12/1974  Fed. Rep. of Germany ............. 357/48
2702681   8/1977  Fed. Rep. of Germany ... 340/347 AD

OTHER PUBLICATIONS

Nordstrom, "IEEE International Solid–State Circuits Conference", 1976, p. 150.
Breuer, "IEEE International Solid–State Circuits Conference", 1972, pp. 146–147.

*Primary Examiner*—Charles D. Miller
*Attorney, Agent, or Firm*—Fulwider, Patton, Rieber, Lee & Utecht

[57] ABSTRACT

A parallel analog-to-digital converter having high speed and high resolution, fabricated on a single integrated-circuit chip in such a manner as to avoid problems typically associated with high speed parallel converters. The converter disclosed by way of example has an eight-bit output, 256 matched comparators for quantizing an analog input signal, and encoding and latching logic for deriving digital outputs from the comparators. Problems related to comparator mismatching, high comparator input capacitance and high comparator input bias current, are effectively minimized by the use of a triple diffusion fabrication process, which substantially reduces the number of defects in the circuit and provides a relatively high component packing density.

9 Claims, 30 Drawing Figures

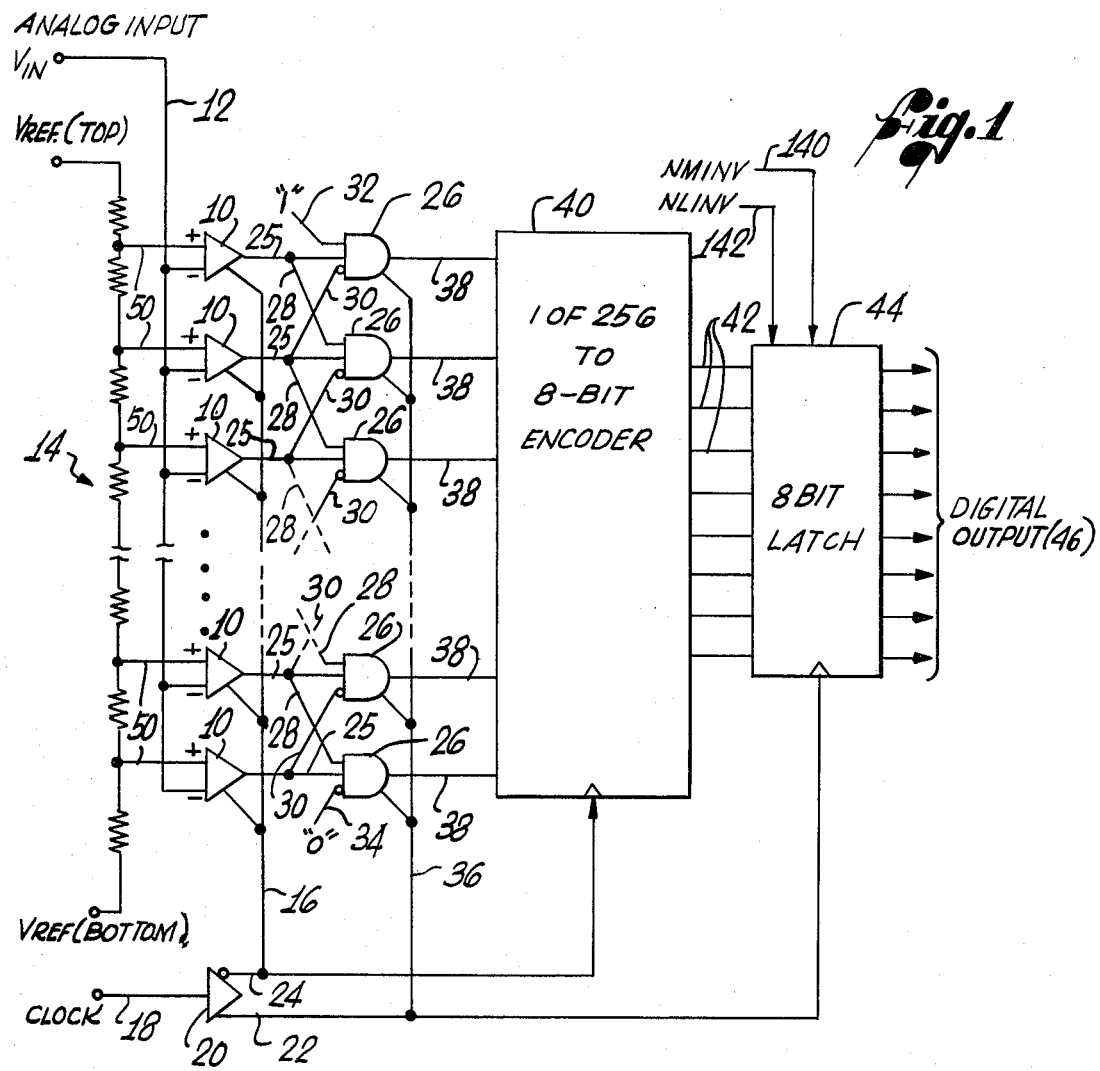
Fig. 1
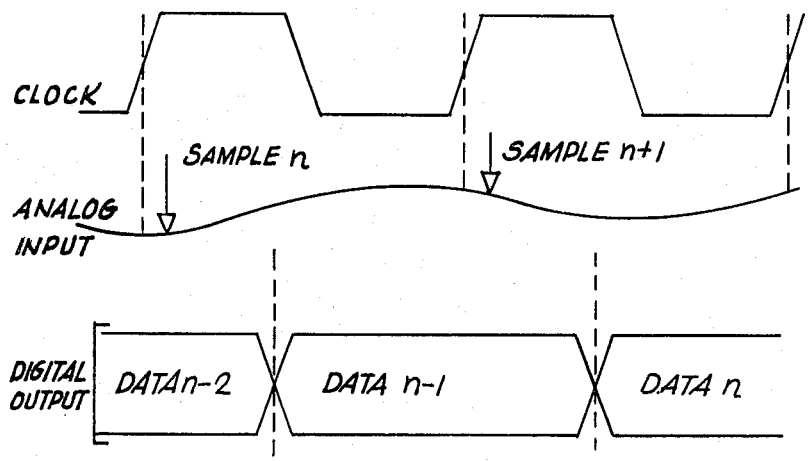
Fig. 2a
Fig. 2b
Fig. 2c

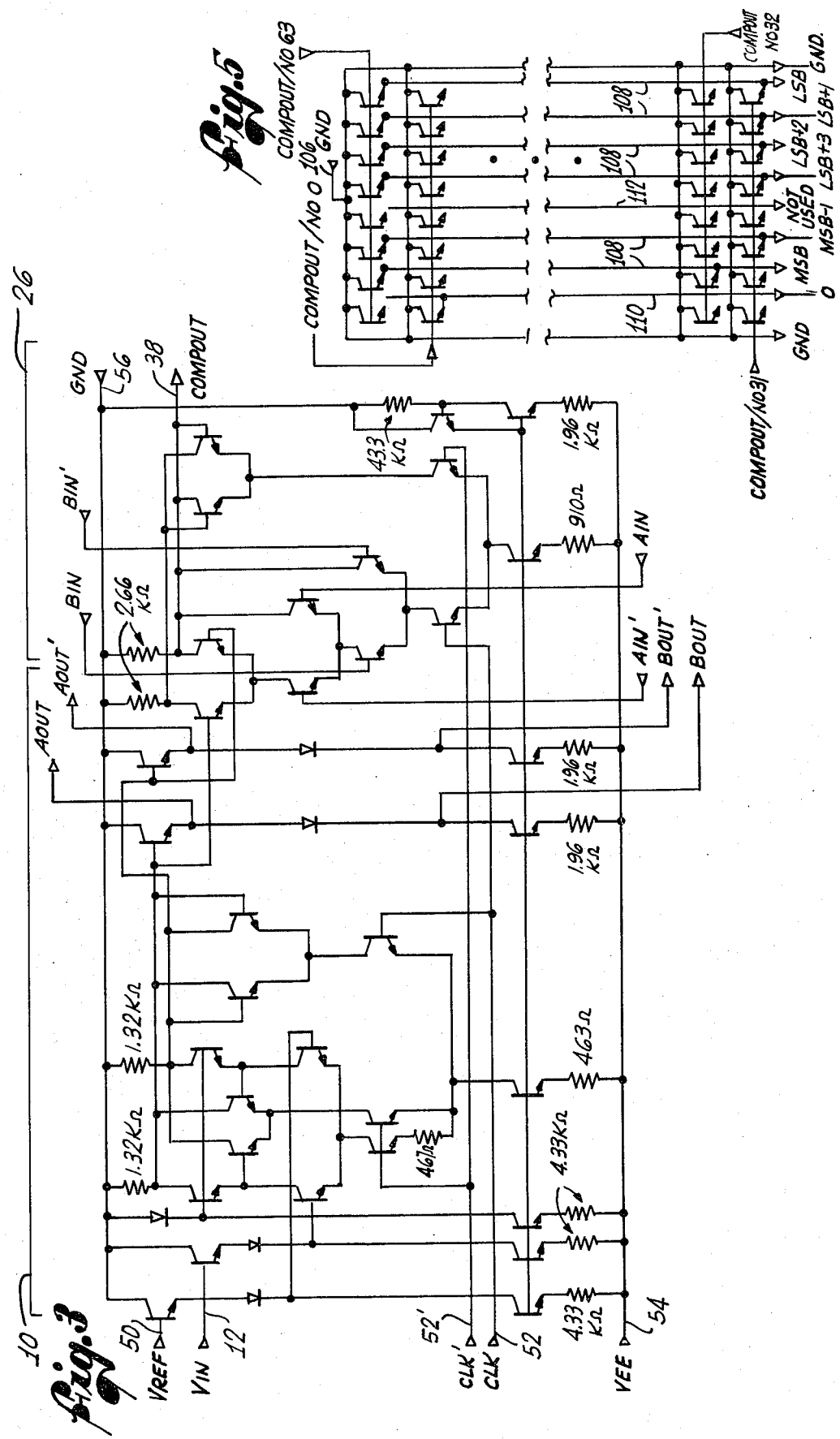

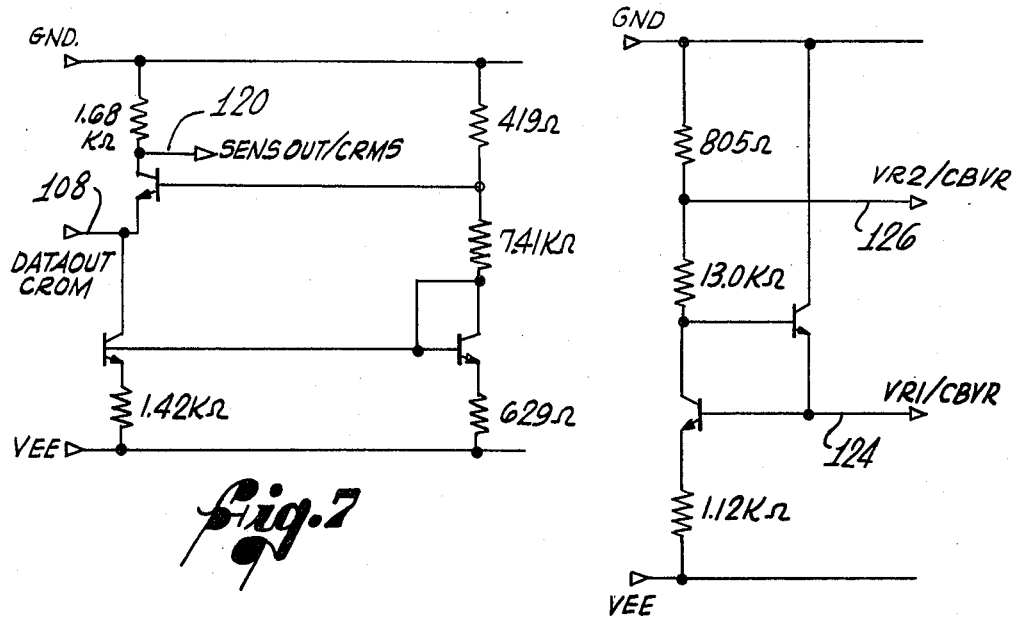
fig.7
fig.9
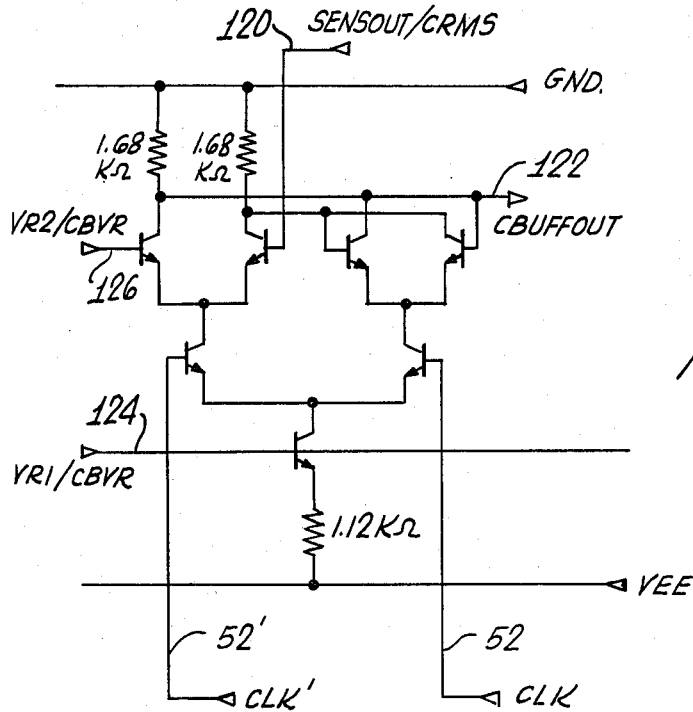
fig.8

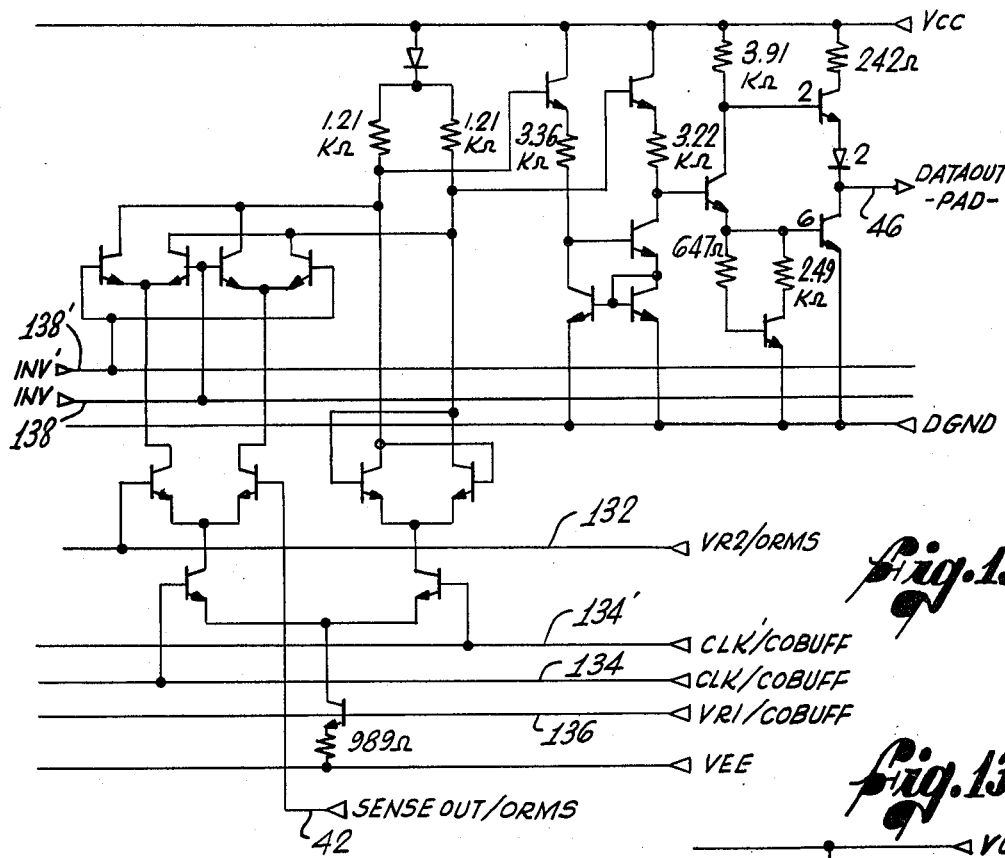
Fig. 13
Fig. 13a
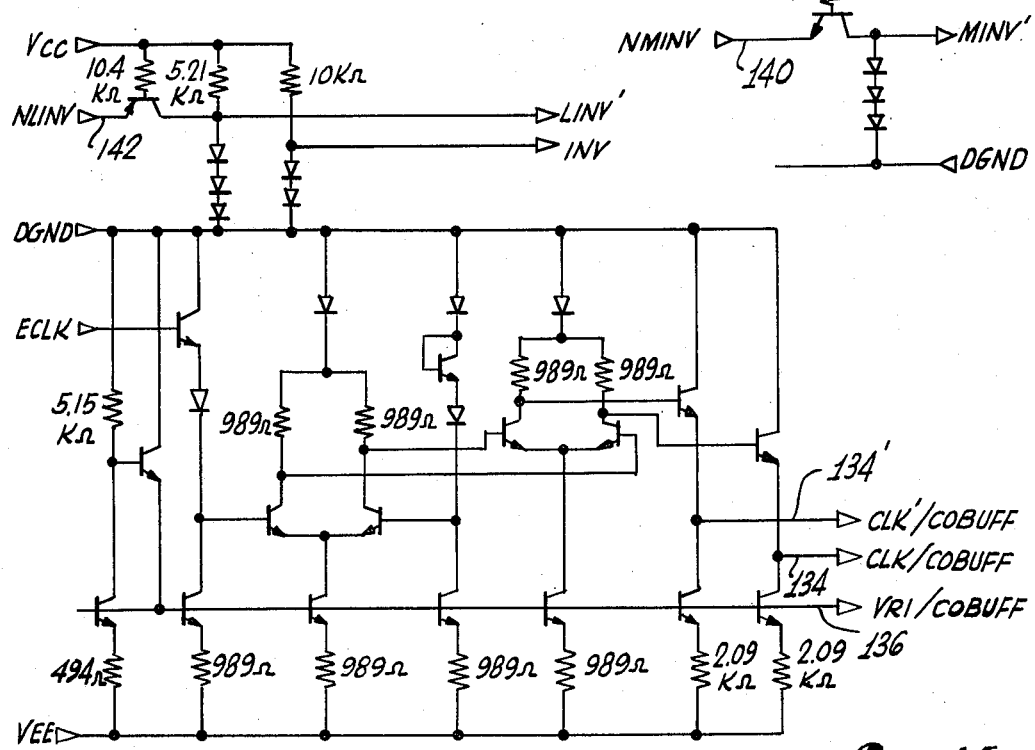
Fig. 14

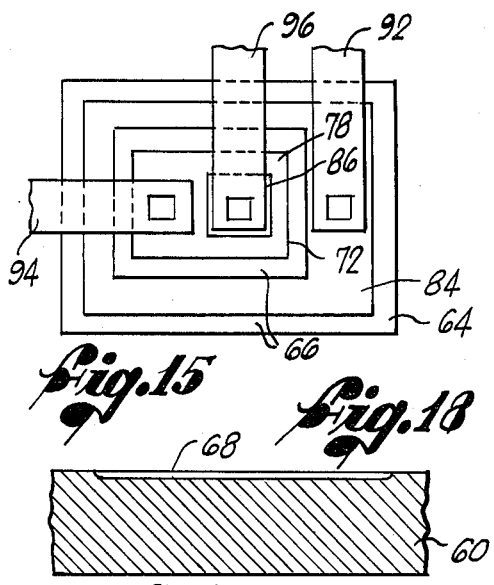
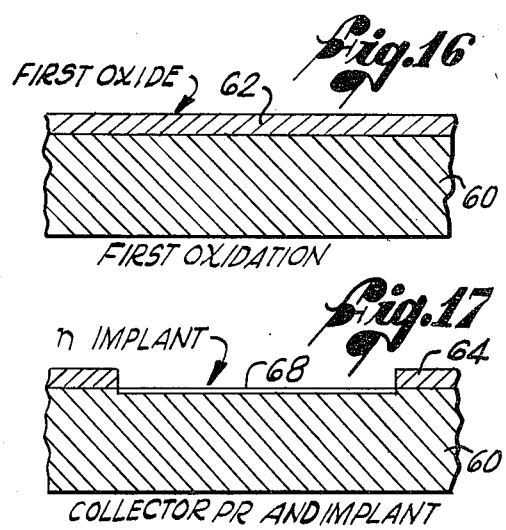
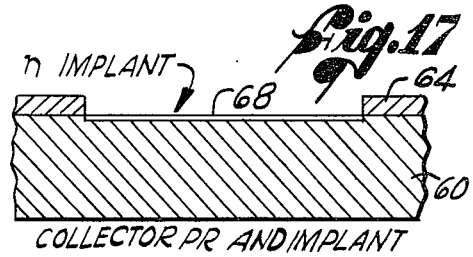
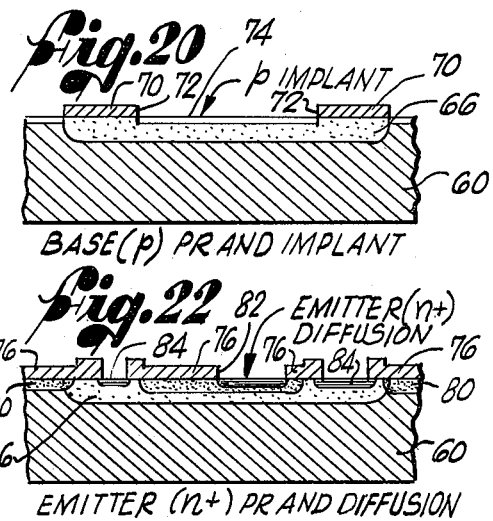
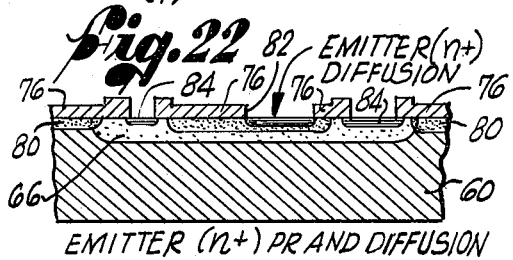
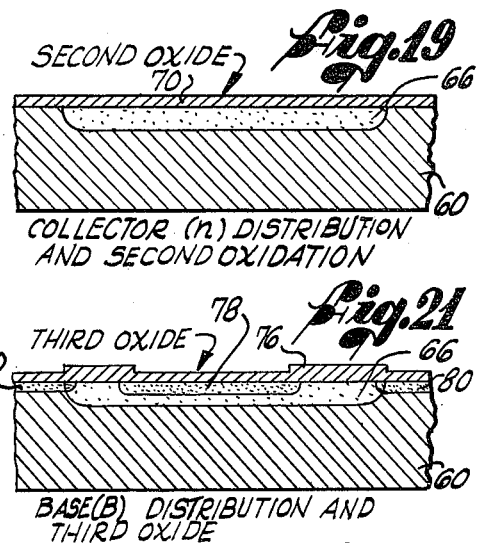
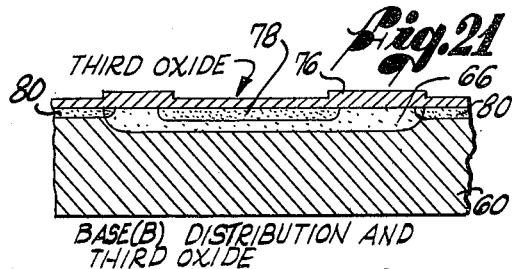
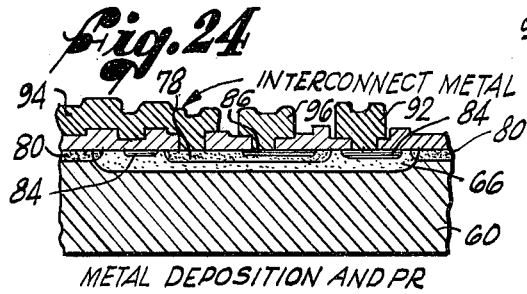
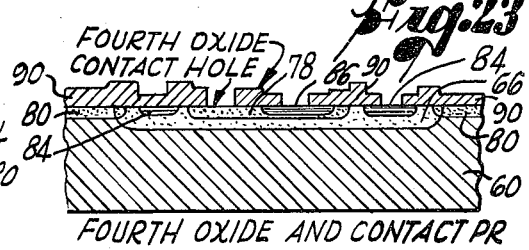
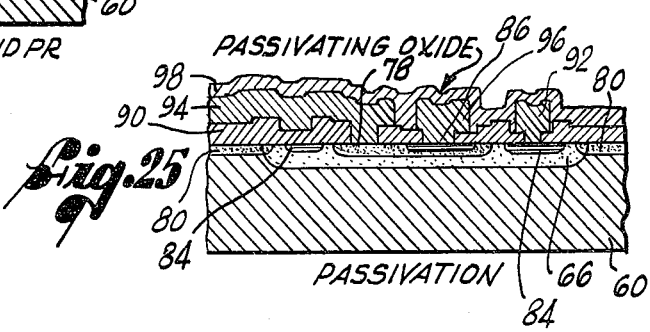

MONOLITHIC TRIPLE DIFFUSION ANALOG TO DIGITAL CONVERTER

BACKGROUND OF THE INVENTION

The present invention relates generally to analog-to-digital converters, and, more particularly, to analog-to-digital converters capable of operating at very high speeds and suitable for processing signals having high frequency components, such as video signals.

In general, there are a variety of techniques available for conversion of an analog signal to an equivalent digital signal. An analog signal is one that can vary continuously over a range of values and can assume any value within the range, whereas a digital signal takes the form of a numerical quantity representing the value of one of a number of discrete steps in the signal range. The technique best suited for high speed analog-to-digital conversion is known as parallel conversion. In a parallel converter, an input analog signal is simultaneously compared with a number of different reference signals, each corresponding to a discrete step in the signal range. The simultaneous comparison operations are performed in a set of matched comparators. For a zero input signal, for example, all the comparators provide outputs of the same state, and as the input signal increases in value, an increasing number of the comparators provide outputs of the opposite state. In this manner, the analog input signal is quantized, i.e., is recognized as falling between two adjacent discrete levels in the signal range. If an n-bit binary output is required, the input signal is quantized into one of $2^n$ different quantization levels, utilizing $2^n-1$ comparators. Typically, the outputs of the comparators are then processed to provide the desired n-bit binary code equivalent to the instantaneous value of the analog input signal.

For many high speed analog-to-digital conversion applications, the resolution required is equivalent to eight bits or more, and the analog signal must be quantized into $2^8$ or 256 discrete levels to attain the desired resolution. This would require 255 matched comparators and approximately 20,000 individual components. Such a device has been manufactured using discrete components, but was found to suffer from a number of significant drawbacks, not the least of which was extremely high cost. The principal disadvantage of such a converter was that the 255 discrete comparator circuits could not always be perfectly matched in their performance characteristics. Futhermore, the input capacitance of the comparators used was relatively high, and a costly buffer amplifier had to be used in many instances. To add further to the cost of such a device using discrete components, differential delays in the converter necessitated use of a sample-and-hold circuit.

Although it might appear that the use of field effect transistors (FET's) in a monolithic circuit would avoid these difficulties, this is not the case. If field-effect transistors are used, an inherently higher mismatch in threshold levels, usually referred to as $\Delta V_t$, can lead to ambiguity in the states of the comparators, and resultant unreliability of the device.

An alternative approach for obtaining high resolution in parallel analog-to-digital converters is to use cascaded stages of smaller parallel converters. For example, a first four-bit converter could be used to quantize the analog input signal into one of sixteen levels, and a second four-bit converter used to provide a further four bits of resolution. Although this approach reduces the complexity of the overall conversion system, the two separate conversions result in a greater time delay, and necessitate the use of additional components, including a sample-and-hold circuit and a digital-to-analog conversion circuit.

It is an object of the present invention to provide a parallel analog-to-digital converter with a resolution of at least five bits, which avoids all of the aforementioned disadvantages and thereby provides a practical, high resolution, high speed converter.

SUMMARY OF THE INVENTION

The present invention resides in a monolithic, parallel, high speed, analog-to-digital converter circuit having a resolution of at least five bits. Clearly, it would be highly advantageous, both from a user standpoint and from a manufacturing standpoint, to produce an analog-to-digital converter of this type on a single integrated-circuit chip. However, because a parallel analog-to-digital converter has such a large number of circuit elements, and therefore requires a relatively large chip area, its manufacture in integrated-circuit form using conventional fabrication techniques results in a relatively large number of circuit defects in each chip. This, in turn, leads to mismatching of the comparators, and resultant inoperativeness or, at best, inaccuracy of the device. The circuit of the present invention is a high speed, parallel, analog-to-digital converter manufactured utilizing a triple diffusion process to avoid the problems of a more conventional epitaxial layer fabrication process, and to provide an acceptably high production yield.

Although a monolithic analog-to-digital converter with a resolution as high as eight bits might be manufactured using a conventional epitaxial layer fabrication technique, the defect density of such a circuit would be so high that the manufacturing yield, i.e., the percentage of acceptable products obtained from the process, would be very low, probably less than 1%, and the manufacturing costs would therefore be unacceptably high. Even the acceptable circuits that might be produced in this manner would have possible comparator mismatching problems. It is well known that, in the epitaxial fabrication process, there are significant defects in the form of spikes on the epitaxial layer. These spikes can tear a photoresist layer usually applied over the epitaxial layer, and can therefore produce significant circuit defects which, in turn, affect the uniformity of the comparator characteristics, as well as the production yield. If the epitaxial process is used, comparator mismatching can also, arise from crystalline defects in the epitaxial layer. In the triple diffusion process, bipolar transistor elements are diffused into a substrate material, and no epitaxial layer is involved. Accordingly, there are no defects due to epitaxial layer spikes, and substantially fewer defects of any kind. Moreover, without the use of the epitaxial layer a flatter surface is obtained, and a circuit pattern of higher resolution may be used, resulting in high density packing of the components, as well as smaller transistors having lower power consumption and lower input capacitances, and having the low input leakage currents required for satisfactory comparator matching. The manufacturing yield for an eight-bit analog-to-digital converter using the triple diffusion process is in excess of 25%, an acceptably high figure for complex circuits.

Basically, and in general terms, the circuit of the invention is a monolithic, parallel, analog-to-digital converter having an n-bit resolution, comprising $2^n-1$ comparators, voltage divider means to provide $2^n-1$ reference voltage levels for application to the comparators, means for coupling an analog input voltage to the comparators, and logic means for converting output signals from the comparators to an equivalent n-bit digit signal. The converter of the invention is fabricated using a triple diffusion technique that provides a feature geometry down to approximately the two-micron level. The triple diffusion process results in the use of relatively low currents, so that the input bias currents to the comparators are kept as low as one microampere. Moreover, by avoiding the epitaxial layer process, the high resolution patterns that can be employed result in transistors that are very much smaller than in the epitaxial device, and that have much lower input capacitance characteristics.

It will be apparent from the foregoing that the present invention represents a significant advance in the field of analog-to-digital converters, in that it provides a very high speed converter on a single integrated-circuit chip, which can be produced at relatively high production yields without any of the inherent disadvantages of discrete-component circuits designed for the same purpose. Other aspects and advantages of the present invention will become apparent from the following more detailed description, taken in conjunction with the accompanying drawings.

BRIEF DESCRIPTION OF THE DRAWINGS

FIG. 1 is a simplified schematic and block diagram of the analog-to-digital converter of the present invention;

FIGS. 2a–2c together constitute a timing diagram showing the relationship between a clock signal, an analog input signal, and corresponding digital output signals;

FIG. 3 is a detailed schematic diagram of a comparator circuit utilized in the converter of the invention;

FIG. 5 is a fragmentary schematic diagram of a portion of a set of 32 column OR gates shown in FIG. 4;

FIG. 7 is a schematic diagram showing a sensor circuit for use with the column OR gates shown in FIGS. 5 and 6;

FIG. 8 is a schematic diagram showing how reference voltages are generated for buffer circuits used in conjunction with the column OR gates of FIGS. 5 and 6;

FIG. 9 is a schematic diagram showing a clocked buffer used to store outputs from the column OR gates of FIGS. 5 and 6;

FIG. 13 is a schematic diagram showing in detail the latch circuit used to store the outputs from the output OR gates of FIGS. 10 and 11;

FIG. 13a is a schematic diagram of an input buffer used to process an inversion control signal applied to the latch circuit of FIG. 13;

FIG. 14 is a schematic diagram showing a clock buffer circuit for generating clock signals for use with the output buffer circuit shown in FIG. 13;

FIG. 15 is a simplified diagrammatic plan view, not drawn to scale, showing a transistor manufactured in accordance with the advanced triple diffusion process, which forms an essential part of the present invention; and FIGS. 16–25 are sectional views illustrating the sequence of process steps performed in the advanced triple diffusion process.

DESCRIPTION OF THE PREFERRED EMBODIMENT

Figure 4:
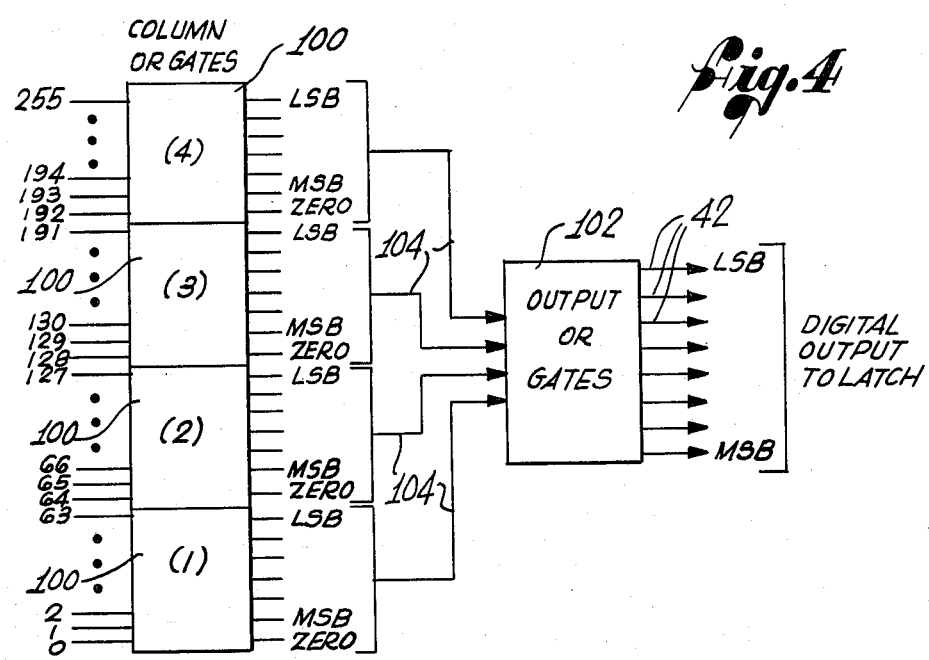
FIG. 4 is a simplified block diagram of the eight-bit encoding circuitry used in the converter of the invention.

As shown in the drawings for purposes of illustration, the present invention is concerned with a monolithic parallel, analog-to-digital converter capable of operation at very high speed. As mentioned earlier in this specification, the basic circuit elements needed to construct a high resolution converter of this type are well known, at least conceptually. Basically, and as shown in FIG. 1, a plurality of comparators, indicated by reference numeral 10, are employed to compare the instantaneous value of an input analog signal, on line 12, with a graduated plurality of reference signals obtained from a precision resistance voltage divider 14.

Each of the comparators 10 provides an output signal of one particular state when the analog input signal exceeds the reference signal level applied to the particular comparator, and provides an output of the opposite state when the analog input signal does not exceed the reference signal. Thus, when the analog input signal is at or near zero, all of the comparator outputs have the same state, but as the analog input signal increases in value, more and more of the comparators change the state of their output signals. In this manner, the arrangement of comparators quantizes the analog signal into one of a plurality of discrete levels, and this level can be further encoded in the form of a binary output signal. Unfortunately, however, for converters having binary outputs of more than four bits, i.e. for resolutions better than 1 part in 16, there are practical difficulties of circuit design that render such a converter virtually impossible to produce using conventional integrated-circuit techniques. Moreover, equivalent circuits using discrete components have thus far proved to be very costly, and not always reliable.

In accordance with the present invention, a parallel, high speed, analog-to-digital converter is provided, utilizing a triple diffusion fabrication process that avoids the inherent disadvantages of the prior art, and thereby provides a reliable and relatively low-cost converter on a single integrated-circuit chip. Many of the circuit design details of the analog-to-digital converter disclosed herein are not critical to the invention. Rather, it is believed that the invention in its broadest sense encompasses the use of an advanced triple diffusion process, which will be discussed in more detail, to fabricate a parallel analog-to-digital converter having a resolution of five or more bits, such resolution being previously unobtainable in a low-cost, single-stage converter. A detailed circuit design for an eight-bit converter is presented herein by way of example, but it will be understood that the invention is not limited to an eight-bit converter, or to any other design details of the disclosed circuit design.

As shown in FIG. 1, a reference voltage indicated as $V_{REF}$, is applied across the precision voltage divider 14 to provide a plurality of reference voltage levels, which are applied to the non-inverting terminals of the respective comparators 10. The analog input voltage on the line 12, is applied to the inverting terminals of the comparators 10, and a clock signal is applied to enable the comparators, as shown at 16. The clock signal is depicted as being supplied from an external source over line 18. Internal clock signals are shown as being generated by an amplifier 20, which has line 18 as its input, and has an inverted output on line 22 and a non-inverted output on line 24. As later described, the clock signals on these lines are employed to control gating logic in various portions of the converter circuitry.

Each of the comparators 10 produces an output signal of one state, a logical zero, when the analog input voltage exceeds the reference voltage applied to the comparator, and produces an output of the opposite state, a logical one, when the analog input voltage is less than the reference voltage. Each of the comparator outputs is applied as one input, over line 25, to a corresponding AND gate, indicated at 26, and each AND gate has two other inputs. For each AND gate 26 except the uppermost one, i.e. the one associated with the highest reference voltage, a second input is supplied by a line 28 from the next highest comparator output. Similarly, for each AND gate except the lowermost one, a third input is supplied by a line 30 from the next lowest comparator output. This third input is inverted. For the uppermost AND gate, the second input signal is a permanently supplied logical one, as shown at 32, and for the lowermost AND gate, the third, inverted input is a permanently supplied logical zero, as shown at 34. The AND gates 26 are all enabled by a clock signal on line 36, obtained from line 22.

In the embodiment illustrated in detail in the drawings, there are 256 comparators 10, although it will be appreciated that only 255 comparators are needed to quantize an analog signal into one of 256 discrete levels. Using 256 comparators and related components preserves the symmetry of the circuitry, and helps achieve the desired objective of matching the electrical characteristics of the comparators.

The purpose of the AND gates 26 is to provide a signal on only one of 256 lines, the output lines 38 from the AND gates. It will be apparent from inspection of the AND gate logic that, when all the comparator outputs are logical ones, the lowermost AND gate will have a logical one output, but all higher AND gates will have zero outputs. If the lowermost comparator output is a zero, and all the other comparator outputs are ones, the lowermost AND gate will provide a zero output, the second AND gate will provide a one output, and all of the higher AND gates will provide zero outputs. Thus, it will be seen that, in general, the output of the AND gate at the same level as the lowest comparator having a one output will also be one, while all other AND gate outputs will be zero. When all the comparator outputs are zero, all of the AND gates will have zero outputs.

The outputs of the AND gates 26 are next gated over the output lines 38 into an encoder 40, which is operative to convert the 1-of-256 input to an eight-bit output code on lines 42. The output code is then gated into an eight-bit latch 44, from which the desired output signal is derived on lines 46. Operation of the encoder 40 is controlled by clock signals on line 24, and operation of the latch 44 by clock signals on line 22.

FIGS. 2a, 2b and 2c illustrate the basic timing relationships of the converter. As shown in FIG. 2a, a periodic clock signal is employed to time sampling of the analog input signal shown by way of example in FIG. 2b. FIG. 2c shows the timing of possible single-bit digital output changes from zero to one or one to zero. It will be appreciated from FIGS. 2a–2c that there is a time delay of somewhat more than one clock period between the sampling of analog data and the generation of corresponding digital data, the delay corresponding to the propagation time through the AND gates 26 and encoder logic 40.

Any of a number of different comparator designs could be used in practicing the present invention. However, by way of illustration, the specific comparator circuit module design presently preferred is shown in detail in FIG. 3. This circuit module includes both a comparator 10 and an AND gate 26. It will be noted that both the comparator and AND gate utilize, for the most part, differential circuitry and current mode logic. Although this arrangement requires a large number of component parts, it minimizes the necessity for a very accurate reference voltage and for close tracking of comparator output levels, both of which would be essential if a single-ended circuit scheme were used. The comparator and AND gate circuit module shown in FIG. 3 has a $V_{REF}$ input line 50, an input line 12 for the analog input voltage $V_{IN}$, and an AND gate output line 38, the output signal being indicated by the signal name COMPOUT.

The comparator circuit 10 provides two pairs of output signals, designated AOUT, AOUT' and BOUT, BOUT', respectively. These supply the output signals for cross-connection to adjacent ones of the AND gates 26, as indicated by lines 28 and 30 in FIG. 1. Similarly, the AND gate circuit 26 has two pairs of input signals, designated AIN, AIN', and BIN, BIN' for connection of the AND gate inputs. It will be appreciated that different AND gate circuitry must be employed for processing outputs from the first and last comparators in the system, since these require a logical one and a logical zero to be permanently supplied to the respective AND gates.

The comparator circuit module of FIG. 3 also includes inverted and non-inverted clock terminals, indicated at 52 and 52', to which signals CLK and CLK' are applied. These internal clock signals are generated from the externally applied clock signal, by the circuits illustrated in FIGS. 14a and 14b. The circuit module of FIG. 3 also has a power supply terminal 54, and a ground terminal 56. The ohmic values of the resistance elements in the circuit are given directly on the circuit diagram, and the NPN transistor elements are fabricated as will now be described in more detail.

The triple diffusion process by which the analog-to-digital converter of the present invention is fabricated is illustrated in FIGS. 15–25. As shown in FIG. 16, a silicon substrate 60 is coated with a first oxide layer 62.

Then, as shown in FIG. 17, a rectangular area or window, indicated by reference numeral 64, of the first oxide layer 62 is removed, and an N type material, in this case phosphorous, is implanted in what is to become the collector region of the transistor, indicated at 66 in FIGS. 19 and 20.

The area of the collector region 66, and the areas of the other diffusion regions of the transistor, are all defined geometrically by means of a conventional photoresist process, referred to as PR in the legends accompanying the drawings, but not illustrated in detail. Basically, in such a process a photosensitive coating known as photoresist is deposited on the oxide, and is then selectively exposed to ultraviolet light through a photolith mask (not shown). In the particular case of the collector region 66, the mask defines the rectangular window 64. The exposed window area of the photoresist is subsequently washed away, and then the oxide in the window area is etched with acid to expose the underlying silicon substrate, leaving the window 64, as shown in FIG. 17. The N type collector material, indicated at 68, can then be implanted in the collector window region, and the remaining oxide layer 62 stripped off, to leave the structure as indicated in FIG. 18. In a subsequent diffusion operation, a second oxide layer 70 is formed as indicated in FIG. 19, and the N type collector material 68 is diffused into the substrate 60 to form the collector region 66.

The collector diffusion region 66 is approximately 3.5 microns deep, has a surface concentration of $2 \times 10^{17}$ cm$^{-3}$ and a sheet resistance of approximately 500 ohms per square. Sheet resistance, as is well known, is a term usually applied to the electrical resistance of a conductive or semiconductive layer. The resistance to current flow from one edge of a square sheet of such a layer, to the opposite edge, is independent of its area.

Next, as shown in FIG. 20, the second oxide layer 70 is selectively removed to form a base-region window, indicated at 72. Portions of the oxide layer 70 is situated outside of the collector region 66 are also removed. Then, a P type material, in this case boron, is implanted in the base-region window 72, as indicated at 74, and is also implanted in the exposed regions of the substrate outside of the collector region 66. Then, as shown in FIG. 21, a third oxide layer 76 is added, and the boron is diffused to a depth of approximately 1.2 microns, to form the base region 78. The base region has a depth of approximately 1.2 microns, a surface concentration of $1 \times 10^{19}$ cm$^{-3}$ and a sheet resistance of 150–200 ohms per square. The P type boron material is also diffused into the surrounding field region outside of the collector region 66. This field diffusion region, indicated at 80, increases the surface concentration of the substrate 60, and effectively isolates adjacent devices from each other.

Next, as shown in FIG. 22, the third oxide layer 76 is selectively removed, again using the photoresist process, to expose an emitter-region window 82 over the base region 78, and also to expose a continuous rectangular strip 84 (FIG. 15) over the collector region 66. An N+ type phosphorous emitter material is deposited in the exposed areas, and is diffused to a depth of approximately 0.9 micron, to form the emitter region 86, and also to form a continuous N+ type region beneath the rectangular strip 84 around the collector region, for purposes of making contact with the collector. The surface concentration of the emitter region 86 is approximately $1 \times 10^{21}$ cm$^{-3}$ and the sheet resistance is approximately 18–25 ohms per square.

As shown in FIG. 23, a fourth oxide layer 90 is applied over the already formed layers, and is selectively removed to expose contact holes to be used for making electrical contact with the various semiconductor regions. Then metal contact strips are formed, again using a conventional photoresist process that is not shown in detail. First, a metalized layer is applied over the entire structure, then a photoresist layer is applied over the metal, selectively exposed through a photolith mask, and washed away to leave photoresist material over those areas of metal to be retained. Then the remaining, unmasked areas of metal are etched away to leave the interconnecting metal strips shown in the drawings. In particular, as shown in FIG. 24, there is a collector contact strip 92, which makes contact with the N+ field diffusion layer 84 around the outer periphery of the collector area 66, a base contact strip 94, which makes direct contact with the base region 78, and, finally, an emitter contact strip 96, which makes direct contact with the center of the emitter region 86. The final step in the fabrication process is the application of a passivating oxide layer 98 over the entire structure.

The metal contact strips 92, 94 and 96 are single layers approximately 8,000–12,000 angstroms thick (0.8–1.2 microns). Each metalized layer comprises a thin first coating of titanium, approximately 50 angstroms thick, with the remainder of the layer comprising copper and aluminum. The metal strips are spaced by a minimum of 2 microns from each other, and are a minimum of 5 microns wide, after shrinkage during the fabrication process. All other features of the device have a minimum geometry of 2 microns, which applies to both width and spacing. Thus, the circuit is said to have a "two-micron feature geometry", meaning that, in plan view, all semiconductor regions have a minimum dimension of two microns, measured in the plane of the device, and are spaced from each other by a minimum dimension of two microns, measured in the same plane. The areas of the semiconductor regions can be dimensioned as desired, within this geometric limitation. For example, the emitter region 86 in one presently preferred embodiment is approximately 5–6 microns wide, and the contact holes are 3 microns wide.

The encoder 40 and latch 44 shown in FIG. 1 can follow any appropriate circuit design. However, an exemplary design is illustrated in FIGS. 4–14b, for an eight-bit encoder. As shown in FIG. 4, the encoder logic comprises four OR gate circuit modules 100, referred to as column OR gates, and a set of output OR gates 102, which functions to combine the outputs from the column OR gates. Each of the column OR gate modules 100 has 64 binary inputs and generates a six-bit coded output on six data lines, together with a zero-bit output signal, which is employed to indicate when the six data bits are all zero. The four sets of seven-bit outputs are fed over lines 104 to the output OR gates 102, where they are logically combined to produce an eight-bit digital output for transmission to the latch 44.

As shown in FIG. 5, each column OR gate circuit module 100 comprises a plurality of NPN transistors. More specifically, there are 64 rows, each containing eight such transistors. The collector terminals of all the transistors in the module are commonly connected to ground, as indicated at 106, and each of the 64 input lines is connected to the base terminals of one row of transistors. Four such input lines are shown by way of example in FIG. 5, and these are designated by the signal names COMPOUT/NO. 0, 31, 32 and 63. Also included in a column OR gate are seven output lines, comprising the six data lines 108 and the zero line 110, to which the emitter terminals of the transistors are selectively connected. An eighth parallel line 112, and a corresponding "column" of transistors shown in FIG. 5 are not used in the illustrative eight-bit configuration.

Selective connection of the output lines 108 and 110 to the emitter terminals of the transistors provides for the conversion of a discrete voltage level, indicated by a signal on one of the 64 input lines, to a corresponding binary code. For example, row #0 of the transistors has the "zero" column transistor emitter terminal connected to the "zero" output line 110, but none of the other transistors in row #0 has its emitter terminal connected to an output line. Thus, when input line #0 to the column OR gate module supplies an input signal to the module, only the "zero" output line 110 is affected. By way of further example, row #31 of transistors has five transistors connected to the output data lines 108, to impress on the data lines the pattern 011111, which will be recognized as the binary code for the decimal number 31.

Figure 6:
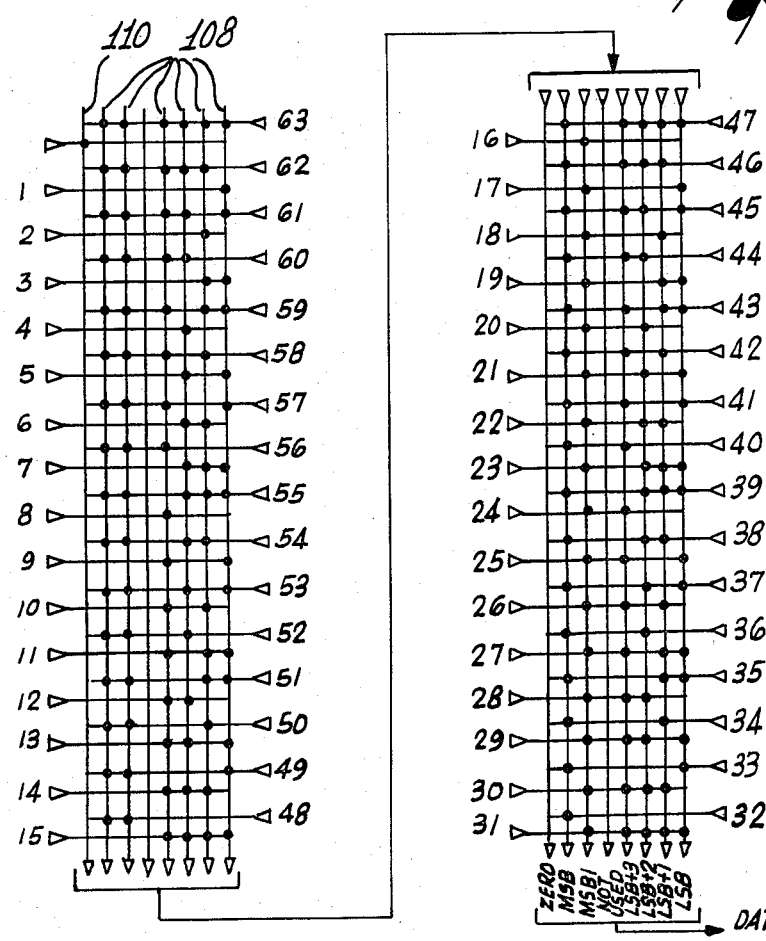
FIG. 6 is a diagrammatic view showing how all of the set of column OR gates of FIG. 5 are connected.

The complete arrangement of transistor connections for each of the column OR gate modules 100 is shown diagrammatically in FIG. 6. The vertical lines in FIG. 6 are the output lines 108 and zero line 110, and the horizontal lines numbered 0-63 represent the input lines. The dots represent connections between emitter terminals and output lines. It will be appreciated that not all of the transistors in the column OR gate modules are utilized, and that the unnecessary transistors need not be present at all. However, for purposes of manufacturing efficiency, it is convenient to fabricate the column OR gate modules all in identical form, each with a full complement of transistors, and then to "program" each of the modules, in a metalization step, by appropriately connecting the emitter terminals to the output data lines.

Each of the output lines 108 and 110 from the column OR gates 100 is connected to a sensing circuit of the type shown by way of example in FIG. 7. Thus, when a transistor in one of the column OR gates 100 is rendered conductive by a signal impressed at its base terminal, its emitter terminal is connected to one of the output lines 108, and the resultant signal current will be reflected in a change in state in the sensed output signal on line 120 in FIG. 7. The sensed output signals representing all of the column OR gate outputs are then passed to clocked buffers, of which one is shown in FIG. 8, and from which output signals are generated on lines 122, under control of internal clock signals on lines 52 and 52'. Reference voltages on lines 124 and 126, utilized by the clocked buffer circuit of FIG. 8, are generated from a power supply voltage by the circuit shown in FIG. 9.

Figure 10:
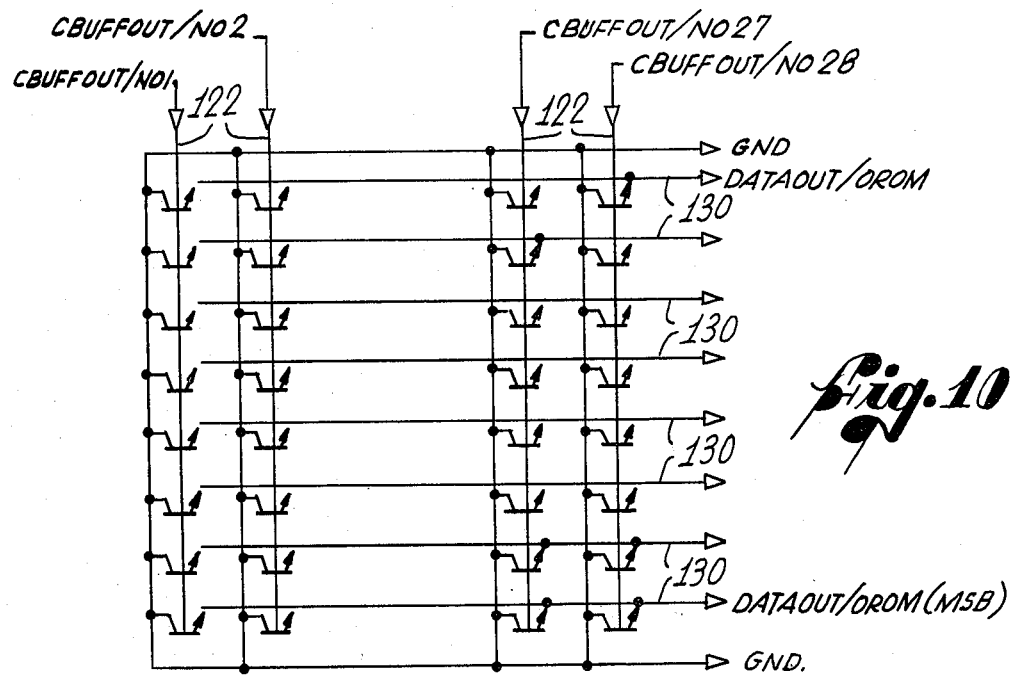
FIG. 10 is a fragmentary schematic diagram showing portions of a set of output OR gates used to combine the outputs from the column OR gates of FIGS. 5 and 6.
Figure 11:
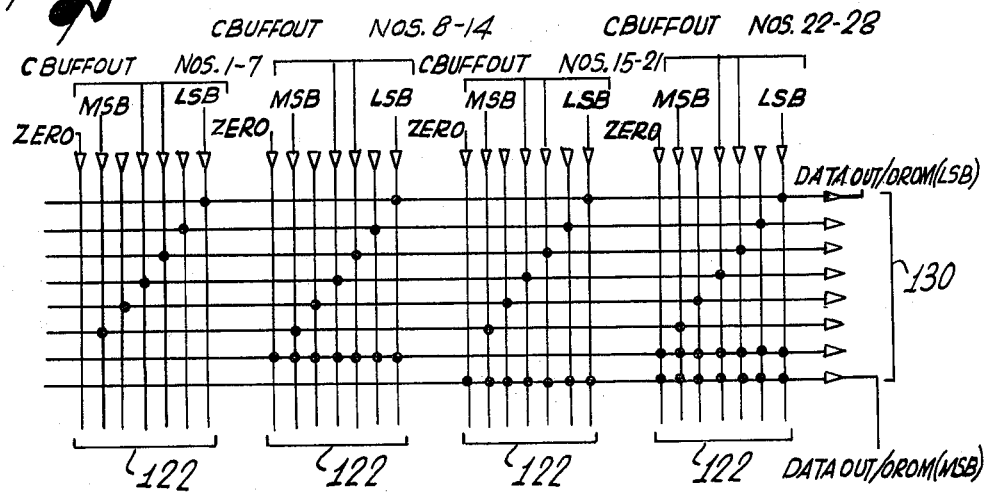
FIG. 11 is a diagrammatic view showing how all of the output OR gates are connected to provide digital outputs.

The buffered data outputs on lines 122 from the clocked buffer circuits are then supplied to the output OR gates 102, shown in detail in FIGS. 10 and 11. The output OR gates comprise a plurality of NPN transistors arranged in eight rows, each of 28 transistors. The collector terminals of all of the transistors are commonly connected to ground, and the base terminals of each of the 28 columns of transistors are connected, respectively, to the 28 input lines 122 from the buffered outputs of the four column OR gates 100. Eight binary data output lines 130, which appear as horizontal lines in FIG. 10, are selectively connected to the emitter terminals of the transistors to provide an eight-bit digital output. More specifically, and as is apparent from FIG. 11, each set of six data lines, derived from the four column OR gates 100, is essentially ORed to the six corresponding least significant data output lines 130. In addition, each data input line 122 is selectively ORed to the two most significant of the output lines 130, to provide a two-bit code indicating to which set the input data line belongs. In addition, the "zero" lines from the column OR gates are also selectively ORed to the two most significant output data lines. The output OR gates effectively combine the six-bit outputs of the column OR gates 100 to provide the desired eight-bit output. It will be appreciated from FIG. 11 that the four sets of input data lines are connected to the two most significant output lines to form the codes 00, 01, 10 and 11, respectively, thus providing the appropriate eight bits of output data.

Figure 12:
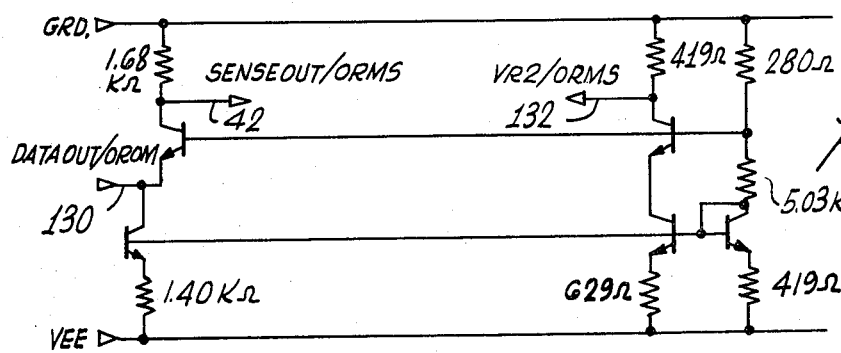
FIG. 12 is a schematic diagram showing a sensing circuit for the output signals from the output OR gates of FIGS. 10 and 11.

A sensing circuit, such as that shown in FIG. 12, is required to sense the output on each the data lines 130 from the output OR gates 102, and to provide a sensed output on lines 42. The sensing circuit also supplies a reference voltage level, designated VR2/ORMS on line 132.

FIG. 13 shows by way of example the detailed design of an output data buffer circuit that serves as the latch 44 (FIG. 1). Input to each of these buffer circuits is derived over line 42 from a corresponding sensing circuit (FIG. 12). Internal clock signals are derived from the circuit shown in FIG. 14, over lines 134 and 134', and a further reference signal is supplied over line 136. Also supplied to the latch circuit of FIG. 13 are two complementary inversion signals, INV and INV', on lines 138 and 138', respectively. The state of these inversion signals provide the means for selective inversion of the signal on line 42 prior to storage in the latch for output on line 46.

The state of the inversion signals supplied to the FIG. 13 circuitry is derived either from an external signal NMINV on line 140 (FIG. 13a), for the most significant digit, or from an external signal NLINV on line 142 (FIG. 14). The inversion signals can be utilized for two's complement operations, which necessitate selective inversion of the most significant bit or the remaining bits.

Figure 14A:
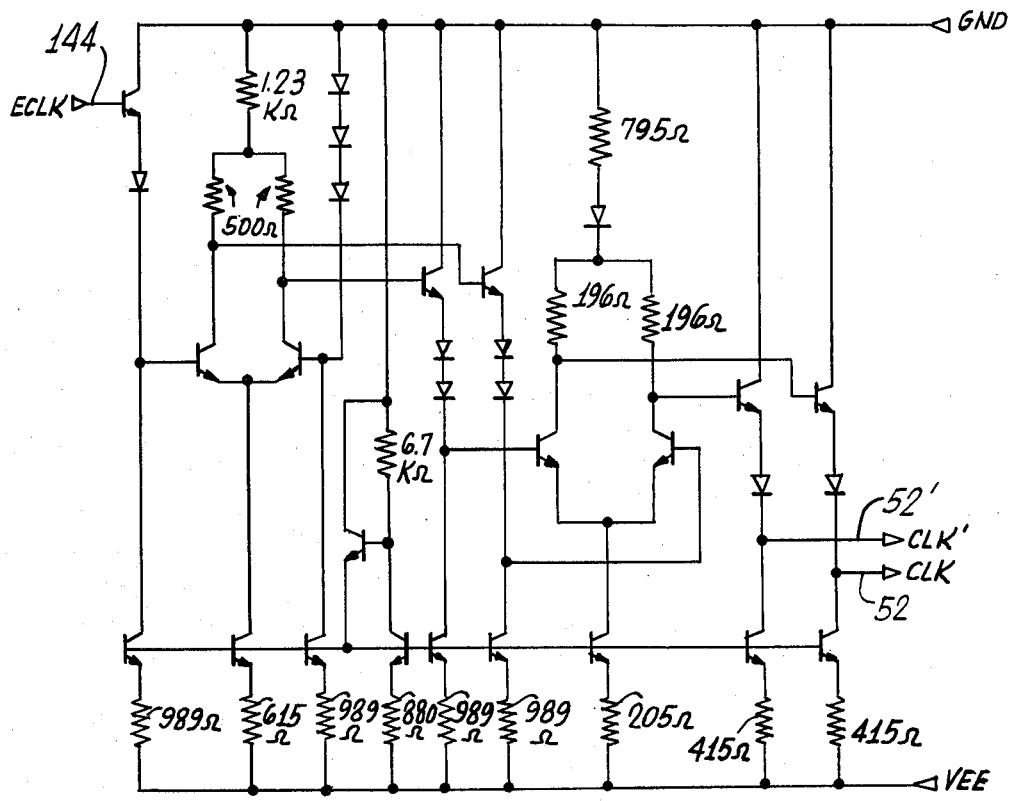
FIG. 14a is a schematic diagram of a clock buffer circuit used to generate internal clock signals.
Figure 14B:
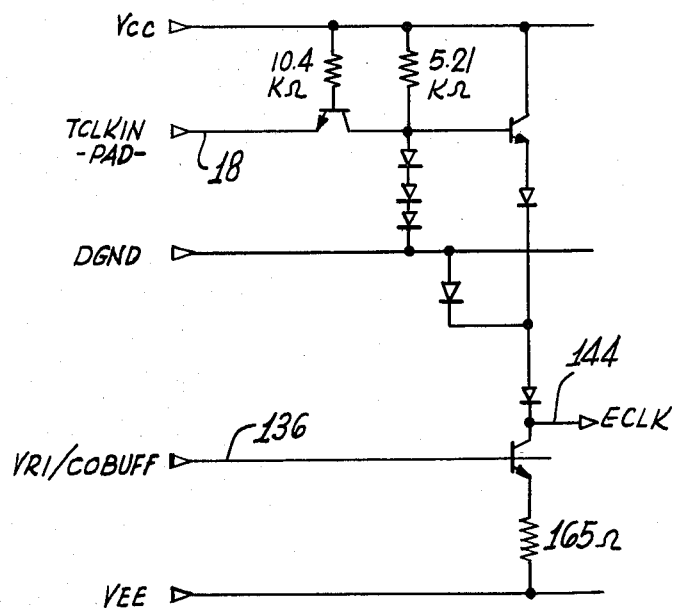
FIG. 14b is a schematic diagram of a clock signal translator circuit for generating an internal clock signal from an externally supplied clock signal.

FIGS. 14a and 14b show a clock signal translation circuit and column clock buffer used to generate various clock signal used in the converter, from an external clock signal supplied on line 18. The FIG. 14b circuit generates a related clock signal named ECLK on line 144, and this is utilized in the FIG. 14a circuit to generate the internal clock signals on lines 52 and 52', and in the FIG. 14 circuit to generate clock signals for the latch, on lines 134 and 134'. It will also be noted that the circuits shown in FIGS. 13, 13a, 14 and 14b all utilize a data-ground signal DGND, also supplied from an external source.

It will be appreciated from the foregoing that the present invention provides a significant advance in the field of analog-to-digital converters. In particular, it provides a hitherto unavailable monolithic, parallel, high speed, analog-to-digital converter with accurately matched comparators having relatively low input capacitance and low input bias current. The converter of the invention can be fabricated at relatively high production yields, to provide a relatively low cost converter suitable for use in many high speed applications.

The eight-bit converter disclosed herein by way of example of capable of digitizing an analog signal at rates from zero to 30 megasamples per second, and can process input signals with frequency components up to 7 MHz. It will also be appreciated that, although this specific embodiment has been illustrated and described in detail by way of example, various modifications may be made without departing from the spirit and scope of the invention. Accordingly, the invention is not to be limited except as by the appended claims.

I claim:

1. A monolithic parallel analog-to-digital converter having an n-bit binary output, where n is at least 5, said converter comprising:

$2^n-1$ comparators;

voltage divider means to provide $2^n-1$ uniformly graduated reference voltage levels for application to one terminal of each of said comparators;

means for coupling an analog input voltage to the other terminal of each of said comparators; and encoding logic means for converting output signals from said comparators to an equivalent n-bit binary signal; and wherein said converter is fabricated in accordance with a high-density triple diffusion process providing a high resolution feature geometry and correspondingly small junction depths, to provide high packing density and high production yield.

2. An analog-to-digital converter as set forth in claim 1, wherein said triple diffusion process provides approximately a two-micron feature geometry.

3. An analog-to-digital converter as set forth in claim 2, wherein said comparators and said encoding logic means include a plurality of NPN transistors.

4. An analog-to-digital converter as set forth in claim 3, wherein each of said transistors has an N type collector region diffused to a depth of approximately 3.5 microns, a P type base region diffused to a depth of approximately 1.2 microns into said collector region, and an N+ type emitter region diffused to a depth of approximately 0.9 micron into said base region.

5. A monolithic parallel analog-to-digital converter having a resolution of one part in thirty-two or better, said converter comprising:

a substrate on which various circuit elements may be formed by a triple diffusion fabrication process;

a plurality of comparators formed on said substrate by the triple diffusion fabrication process, to provide an acceptably high production yield in spite of a large number of required components;

a precision voltage divider also formed on said substrate, to provide a plurality of discrete reference voltage levels for connection to said comparators for comparison with an analog voltage level to be converted; and encoding logic also formed on said substrate, to convert output signals from said comparators to an equivalent digital code.

6. An analog-to-digital converter as set forth in claim 5, wherein said encoding logic includes:

first logic means for generating a 1-in-n code indicative of the analog voltage level, where n is at least 32; and second logic means for generating a multiple-bit binary code equivalent to the 1-in-n code.

7. An analog-to-digital converter as set forth in claim 5, wherein said triple diffusion process provides approximately a two-micron feature geometry.

8. An analog-to-digital converter as set forth in claim 7, wherein said comparators and encoding logic include a plurality of NPN transistors.

9. An analog-to-digital converter as set forth in claim 8, wherein each of said transistors has an N type collector region diffused to a depth of approximately 3.5 microns, a P type base region diffused to a depth of approximately 1.2 microns into said collector region, and an N+ type emitter region diffused to a depth of approximately 0.9 micron into said base region.

* * * * *

UNITED STATES PATENT AND TRADEMARK OFFICE
CERTIFICATE OF CORRECTION

PATENT NO. : 4,276,543
DATED : June 30, 1981
INVENTOR(S) : Ralph W. Miller et al.

It is certified that error appears in the above-identified patent and that said Letters Patent are hereby corrected as shown below:

Column 11, line 15 "$2^{n-1}$" should be cancelled and --$2^n-1$-- substituted therefor;

line 16 "$2^{n-1}$" should be cancelled and --$2^n-1$-- substituted therefor.

Signed and Sealed this

Fifteenth Day of March 1983

[SEAL]

Attest:

GERALD J. MOSSINGHOFF

Attesting Officer    Commissioner of Patents and Trademarks